(12) United States Patent
Chen et al.

(10) Patent No.: US 8,022,609 B2
(45) Date of Patent: Sep. 20, 2011

(54) THERMAL FIELD EMISSION CATHODE

(75) Inventors: Zhong-Wei Chen, San Jose, CA (US); Juying Dou, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 383 days.

(21) Appl. No.: 12/145,036

(22) Filed: Jun. 24, 2008

(65) Prior Publication Data

US 2009/0315444 A1    Dec. 24, 2009

(51) Int. Cl.
*H01J 1/14* (2006.01)
*H01J 19/08* (2006.01)

(52) U.S. Cl. ........ 313/310; 313/309; 313/350; 313/351; 445/50; 445/51

(58) Field of Classification Search .......................... None
See application file for complete search history.

(56) References Cited

U.S. PATENT DOCUMENTS

| | | | |
|---|---|---|---|
| 5,449,968 A * | 9/1995 | Terui et al. ................. | 313/362.1 |
| 5,962,961 A | 10/1999 | Sakai et al. | |
| 6,771,013 B2 | 8/2004 | Magera et al. | |
| 6,798,126 B2 | 9/2004 | Schwind et al. | |
| 2003/0128494 A1* | 7/2003 | Birecki et al. ................. | 361/225 |

OTHER PUBLICATIONS

Jaworek, Micro- and nanoparticle electro-spraying, Powder Technology, vol. 176, pp. 18-35, Feb. 20, 2007.*

* cited by examiner

*Primary Examiner* — Anne Hines
*Assistant Examiner* — Tracie Green
(74) *Attorney, Agent, or Firm* — Sawyer Law Group, P.C.

(57) ABSTRACT

A thermal field emission cathode which is employed in an electron microscope, a critical dimension examine tool, an electron beam lithograph machine, an electron beam tester and other electron beam related systems as an electron source is disclosed. Embodiments disclose changing coating shape, coating position and shorten emitter length to extend the lifetime of the field emission cathode.

21 Claims, 4 Drawing Sheets

Figure 1: Prior Art Schottkey Emitter Electron Source

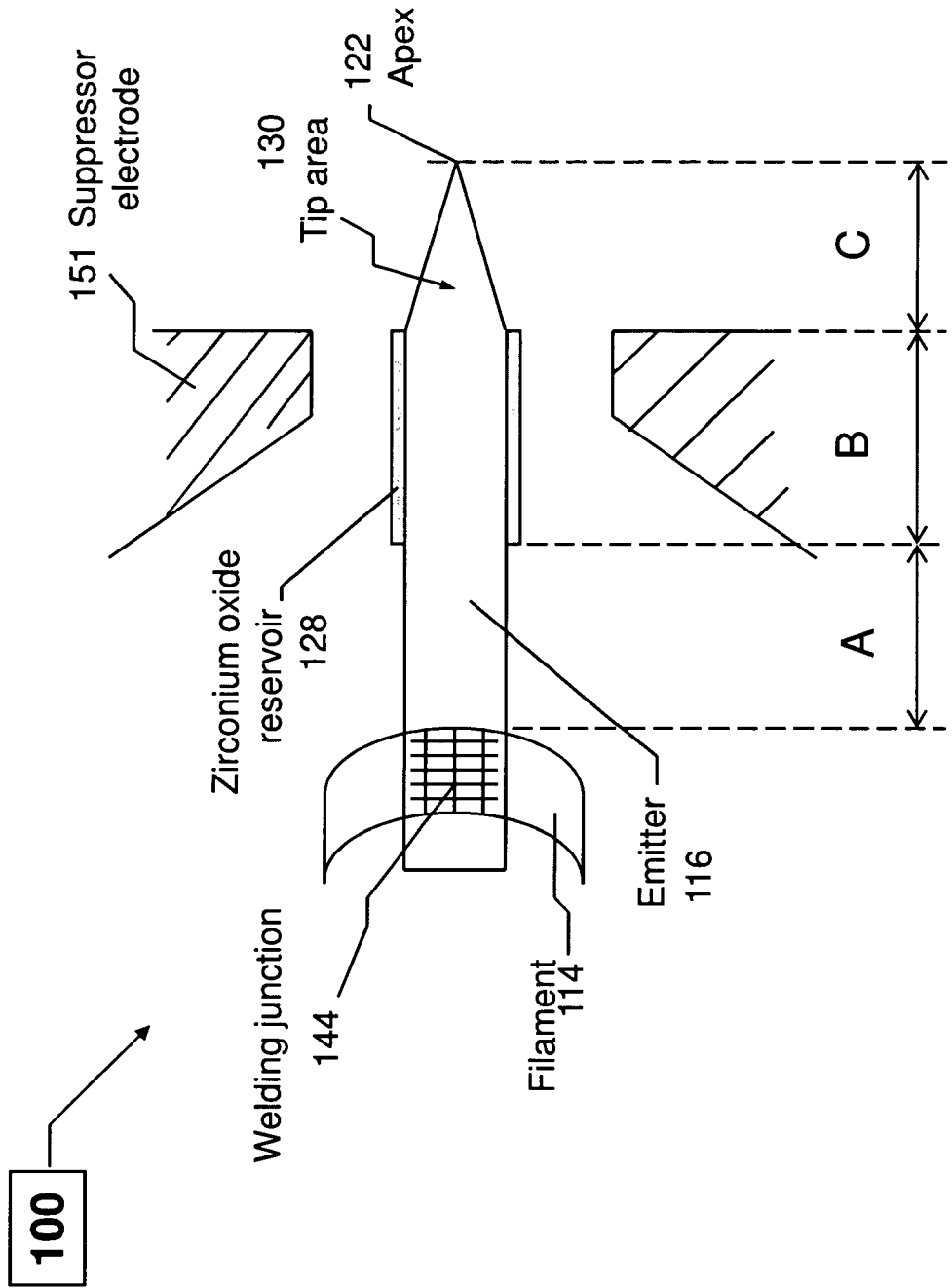
Figure 3: Present Invention Improved Electron Source
Embodiment 1: Thin layer zirconium oxide coating not over suppressor electrode

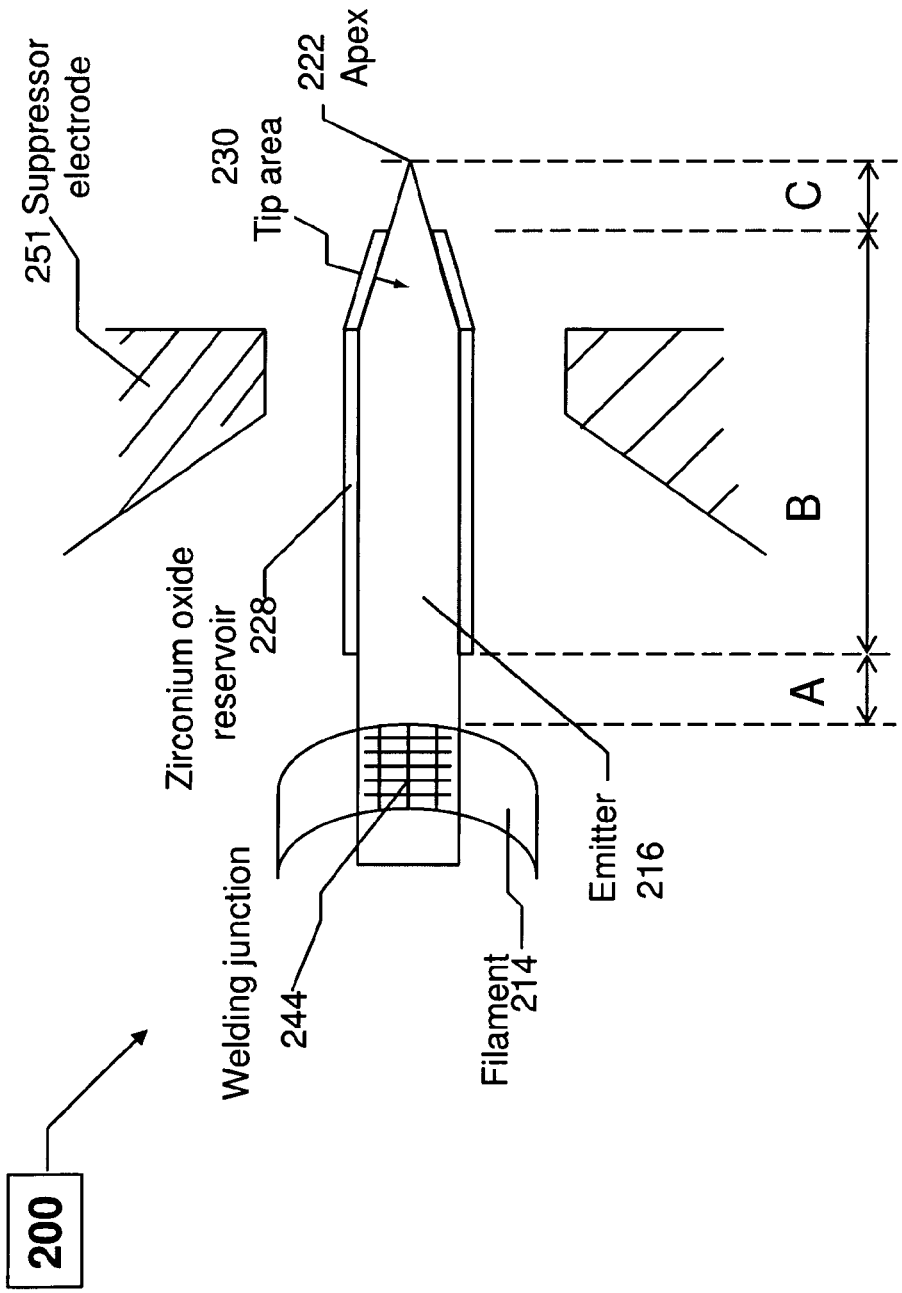
Figure 4: Present Invention Improved Electron Source
Embodiment 2:
Zirconium oxide coating cover region extends over suppress electrode toward apex

THERMAL FIELD EMISSION CATHODE

FIELD OF THE INVENTION

The present invention relates generally to electron sources and more particularly to a thermal field emission cathode which is employed in an electron microscope, a critical dimension examine tool, an electron beam lithograph machine, an electron beam tester and other electron beam related systems as an electron source.

BACKGROUND OF THE INVENTION

Thermal field emission cathodes are used in devices such as scanning electron microscopes, transmission electron microscopes, semiconductor inspection systems, and electron beam lithography systems as an electron source. In such devices, an electron source provides electrons, which are then guided into an intense, finely focused beam of electrons having energies within a narrow range. To facilitate formation of such a beam, the electron source should emit a large number of electrons within a narrow energy band. The electrons should be emitted from a small surface area on the source into a narrow cone of emission. Electron sources can be characterized by brightness, which is defined as the electron current divided by the real or virtual product of the emission area and the solid angle through which the electrons are emitted.

Electrons are normally prevented from leaving the atoms at the surface of an object by an energy barrier. The amount of energy required to overcome the energy barrier is known as work function of the surface. A thermionic emission electron source relies primarily on heat to provide the energy to overcome the energy barrier and emit electrons. Thermionic emission sources are not sufficiently bright for use in many applications.

Another type of electron source, a cold field emission source, operates at room temperature and relies on a strong electric field to facilitate the emission of electrons by tunneling through the energy barrier. A field electron source typically includes a narrow tip at which electrons leaves the surface and are ejected into surrounding vacuum. While cold field emission sources are much smaller and brighter than thermionic emission sources, cold field emission sources exhibit instabilities that cause problems in many applications.

Yet another type of electron source is referred to as a Schottky emission cathode or Schottky emitter. Schottky emitters use a coating on a heated emitter tip to reduce its work function. The coating typically comprises a very thin layer, such as a fraction of a monolayer, of an active metal. In Schottky emission mode, Schottky emitter uses a combination of heat and electric field to emit electrons, which appear to radiate from a virtual point source within the tip. With changes to the emitter temperature and electric field, the Schottky emitter will emit in other emission modes or combinations of emission modes. Schottky emitters are very bright and are more stable and easier to handle than cold field emitters. Because of their performance and reliability benefits, Schottky emitters have become a common electron source for modern electron beam systems.

FIG. 1 shows part of a conventional Schottky emitter 12 described in U.S. Pat. No. 5,449,968 to Terui et al. The Schottky emitter 12 is a portion of a thermal emission cathode as the FIG. 2 presents. The Schottky emitter 12 includes a filament 14 that supports and heats an emitter 16; the emitter 16 having an apex 22 from which the electrons are emitted; and a suppressor electrode 51 to prevent electrons emitting from position other than the apex 22. Heating current is supplied to filament 14 through electrodes 61 that are showed in FIG. 2. The Schottky emitter 12 typically operates with apex 22 at a temperature of approximately 1,800K. Emitter 16 is typically made from a single crystal of tungsten oriented in the <100>, <110>, <111>, or <310> direction. Emitter 16 could also be made of other materials, such as molybdenum, iridium, or rhenium. Emitter 16 is coated with a coating material to lower its work function. Such coating materials could include, for example, compounds, such as oxide, nitrides, and carbon compound, of zirconium, titanium, hafnium, yttrium, niobium, vanadium, thorium, scandium, beryllium, or lanthanum. For example, coating a (100) surface of tungsten with zirconium and oxygen lowers the work function of the surface from 4.5 eV to 2.8 eV. By reducing the energy required to emit electrons, the coating on the emitter 16 makes it a brighter electron source.

At the high temperatures at which Schottky emitter 12 operates, the coating material tends to evaporate from emitter 16 and must be continually replenished to maintain the low work function at apex 22. A reservoir 28 of the coating material, with a shape as water drop on the emitter, is typically provided to replenish the coating on emitter 16. The material from reservoir 28 diffuses along the surface and through the bulk of emitter 16 toward apex 22, thereby continually replenishing the coating on the apex 22. At the Schottky emitter 12 operating temperature, not only the coating material on the emitter 16 and apex 22 evaporate, the coating material also evaporates directly from the reservoir 28, thus depleting it. The evaporation rate of the coating material in the reservoir increases exponentially with the temperature. Thus, the useful life of the reservoir depends upon the amount of material in the reservoir and its temperature.

When reservoir 28 is depleted, Schottky emitter 12 no longer functions properly, and it is necessary to shut down the electron beam system to replace the emitter 16 or the whole Schottky emitter unit 12. This process is time consuming and is costly. It is desirable, therefore, to extend the life of the reservoir 28 as much as possible, thereby extending the life of the emitter 16. The present invention addresses such a need.

SUMMARY OF THE INVENTION

A system and method in accordance with the present invention provides a thermal field emission cathode which is employed in an electron microscope, a critical dimension examine tool, an electron beam lithograph machine, an electron beam tester and other electron beam related systems as an electron source. Embodiments of the present invention disclose changing coating shape, coating position and shorten emitter length to extend the lifetime of the field emission cathode.

BRIEF DESCRIPTION OF THE DRAWINGS

FIG. 3 is a schematic diagrammatic representation of an improved thermal field emission cathode according to an embodiment of the present invention.

FIG. 4 is a schematic diagrammatic representation of zirconium oxide covered region on a thermal field emission cathode according to an embodiment of the present invention.

DETAILED DESCRIPTION OF PREFERRED EMBODIMENTS

The present invention relates generally to electron sources and more particularly to a thermal field emission cathode which is employed in an electron microscope, a critical dimension examine tool, an electron beam lithograph machine, an electron beam tester and other electron beam related systems as an electron source. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not been described in detail in order not to unnecessarily obscure the present invention.

One feature of the cathode is a thin layer coating on the emitter surface to avoid electric induced instability of the field emission cathode.

Another feature is a shortened emitter body to decrease junction temperature, thereby extend the lifetime of the field emission cathode.

Another feature is a design extending the coating cover area through the center bore of suppress electrode. This design shortens the distance that coating material needs to diffuse to apex in the meantime increases the reservoir volume, and therefore extends the lifetime of the improved Schottky emitter. To describe the features of a thermal field emission cathode in accordance with the present invention, please refer now to the following.

Figure 1:
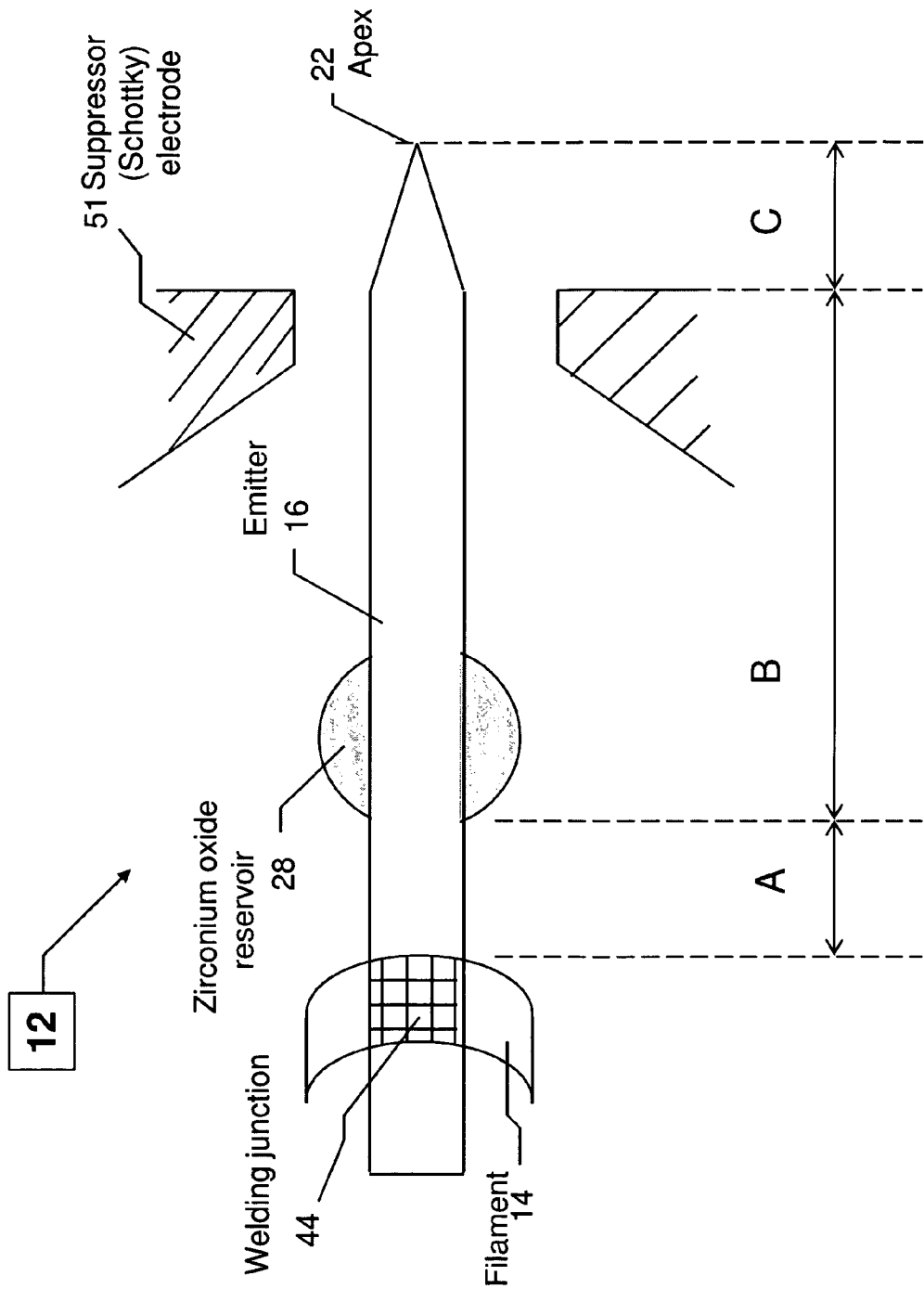
FIG. 1 is a schematic diagrammatic representation of a conventional Schottky emitter, which is a portion of a thermal field emission cathode.
Figure 2:
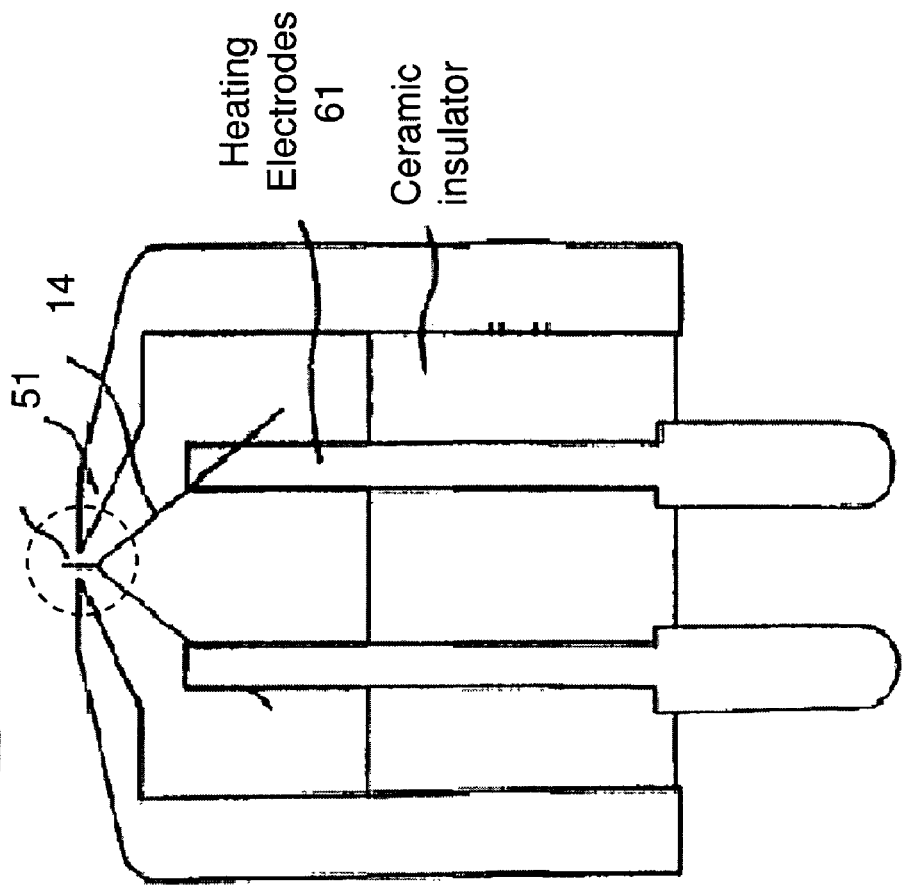
FIG. 2 is a schematic diagrammatic representation of a thermal field emission cathode.

As shown in FIG. 1, the emitter 16 connected to the filament 14 at the welded junction 44 and terminating in the apex 22. Because heat is supplied to emitter 16 from a filament 14, the emitter 16 is hottest at junction 44 and is cooler as the distance from junction 44 increases. The conventional Schottky emitter 12 positioned the reservoir 28 on the emitter 16 away from the junction 44 towards apex 22. Positioning reservoir 28 away from junction 44 allows the reservoir 28 to remain cooler during operation, thereby reducing evaporation of the coating material and increasing the useful life of Schottky emitter. Positioning the reservoir 28 too close to apex 22, the shape of the reservoir may adversely contact the suppressor 51. Even if the reservoir 28 does not contact the suppressor 51, a micro-arcing will be induced between the reservoir 28 and the suppressor 51. The prior art optimum position for the reservoir 28 is at approximately 200 micrometer from junction. 44 toward apex 22. At such a position, thougli the reservoir temperature is cooler than which of junction 44 however, is still way hotter than apex 22. Evaporation and depletion of the coating material of reservoir 28 is still the limiting factor of the useful life of the Schottky emitter 12.

The conventional Schottky emitter 12 can be separate into 3 portions. Portion "A" from junction 44 to reservoir 28, the optimum length of the portion "A" is approximately 200 micrometers. Portion "B" from reservoir 28 to suppressor electrode 51, the optimum length of the portion "B" is approximately 900 micrometers. Portion "C" from suppressor electrode 51 to apex 22, the optimum length of the portion "C" is approximately 250 micrometers. As mentioned above that heat is conducted from junction 44 to the apex 22. As the apex 22 working temperature 1800K, the conventional emitter design will have a temperature above 1930K at junction 44. The reservoir 28, 200 micrometers away from the junction, may experience a temperature in the range of 1910K to 1870K. Positioning the reservoir 28 closer toward the apex 22 could have cooler temperature, but this may induce contact or micro-arcing issue between the reservoir 28 and the suppressor 51. Typically, the water drop like reservoir 28 has a thickness of 60 micrometers at the thickest point.

FIG. 3 is a schematic diagrammatic representation of an improved thermal field emission cathode (Schottky emitter) 100 according to an embodiment of the present invention. One feature of the present invention is illustrated in FIG. 3. This embodiment overcomes the aforementioned contact or micro-arcing issue by changing the shape of reservoir 28 to a "thin layer" coating 128 as the FIG. 3 illustrates. The "thin layer" coating typically has a thickness between 10 and 20 micrometers. Such coating materials could include, for example, compounds, such as oxide, nitrides, and carbon compound, of zirconium, titanium, hafnium, yttrium, niobium, vanadium, thorium, scandium, beryllium, or lanthanum. With the coating thickness design to, for example, a uniformed and not thicker than one half of the diameter of emitter 116, the electric field for suppress electrode will not induce any micro-arcing during emitter 116 operations.

Another feature of the present invention also is illustrated in FIG. 3. A shorter emitter 116 for the improved Schottky emitter 100 via the reservoir 128 is positioned closer to the apex 122 as compared with the conventional Schottky emitter 12 of FIG. 1. As shown, with substantially the same length of portions A and C as in the conventional emitter 16 illustrated in FIG. 1, a shortened potion B' as compared with the portion B in FIG. 1, significantly reduces the overall length of improved emitter 116 illustrates in FIG. 3. In one preferred example, the length of emitter 116 is shortened by 500 micrometers, leading to a reduction of junction temperature from 1930K to 1880K. The lower junction temperature represents smaller heater power consumption, thus also save operation cost besides extending the emitter lifetime.

FIG. 4 is a schematic diagrammatic representation of zirconium oxide covered region on a thermal field emission cathode 200 according to an embodiment of the present invention. And yet another embodiment of the present invention further extends the thin layer coating 228 covering a tip area 230 toward the apex 222. In one preferred example, the coating 228 area starts 100 micrometers from apex 222, which is a location outside of the suppress electrode, to a point 800 micrometers to apex 222, which is within the suppress electrode. This design extend the coating 228 through the center bore of suppress electrode, shortens the distance that coating 228 material needs to diffuse to apex 222 in the meantime increases the reservoir volume, and therefore extend the lifetime of the improved Schottky emitter 200.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. A thermal field emission cathode, comprising:
    an emitter, the emitter comprising an apex wherefrom field emission electrons are released;
    a heating filament, the heating filament being attached to the emitter for providing thermal energy to the emitter;
    a suppressor electrode, the suppressor electrode being set in a spatial neighborhood of the emitter, with the apex extending through the center bore of the suppressor electrode; and
    a coating material reservoir layer formed on the emitter, wherein the thickness of the coating material reservoir is equal to or less than half of the diameter of the emitter, and the coating material reservoir layer extends lengthwise to a tip area of the emitter near the apex.

2. The thermal field emission cathode of claim 1, wherein the location of one end of the coating material reservoir layer is no nearer than 100 micrometers from the apex.

3. The thermal field emission cathode of claim 2, wherein the location of another end of the coating material reservoir layer is no farther than 800 micrometers from the apex.

4. The thermal field emission cathode of claim 1, wherein a predefined portion of the coating layer resides outside of the suppressor electrode with reference to the heating filament material.

5. The thermal filed emission cathode layer of claim 1, wherein the coating material reservoir layer is provided from the group consisting of compounds, such as oxide, nitrides, and carbon compound, of zirconium, titanium, hafnium, yttrium, niobium, vanadium, thorium, scandium, beryllium, or lanthanum.

6. The thermal field emission cathode of claim 1, wherein the coating material reservoir layer is a thin layer coating.

7. The thermal field emission cathode of claim 1, wherein the coating thickness is uniform and not thicker than half of the diameter of the emitter.

8. The thermal field emission cathode of claim 6, wherein the thickness of the thin layer coating is in the range of approximately 10-20 micrometers.

9. The thermal field emission cathode of claim 3, wherein a temperature of the location of the heating element being attached to the emitter is less than 1930K.

10. The thermal field emission cathode of claim 9, wherein a temperature of the location of the heating filament being attached to the emitter is about 1880K.

11. The thermal field emission cathode of claim 4, wherein a distance between the location of the heating filament being attached to the emitter and the apex is about 850 micrometers.

12. A thermal field emission device for electron beam tool, comprising:
    an emitter less than 1350 micrometer, the emitter comprising an apex wherefrom field emission electrons are released;
    a heating filament, the heating filament being attached to the emitter for providing thermal energy to the emitter;
    a suppressor electrode, the suppressor electrode being set in a spatial neighborhood of the emitter, with the apex extending through the center bore of the suppressor electrode; and
    a coating material reservoir layer formed lengthwise on the emitter, wherein the thickness of the coating material reservoir is equal to or less than half of the diameter of the emitter.

13. The thermal field emission cathode of claim 12, wherein the location of one end of the coating material reservoir layer is no nearer than 100 micrometers from the apex.

14. The thermal field emission cathode of claim 13, wherein the location of another end of the coating material reservoir layer is no farther than 800 micrometers from the apex.

15. The thermal field emission cathode of claim 12, wherein a predefined portion of the coating layer resides outside of the suppressor electrode with reference to the heating filament material.

16. The thermal filed emission cathode layer of claim 12, wherein the coating material reservoir layer is provided from the group consisting of compounds, such as oxide, nitrides, and carbon compound, of zirconium, titanium, hafnium, yttrium, niobium, vanadium, thorium, scandium, beryllium, or lanthanum.

17. The thermal field emission cathode of claim 12, wherein the coating material reservoir layer is a thin layer coating.

18. The thermal field emission cathode of claim 16, wherein the coating thickness is uniform and not thicker than half of the diameter of the emitter.

19. The thermal field emission cathode of claim 16, wherein the thickness of the thin layer coating is in the range of approximately 10-20 micrometers.

20. The thermal field emission cathode of claim 13, wherein a temperature of the location of the heating filament being attached to the emitter is less than 1930K.

21. The thermal field emission cathode of claim 14, wherein a temperature of the location of the heating filament being attached to the emitter is about 1880K.

* * * * *